United States Patent
Park et al.

(10) Patent No.: US 8,288,275 B2
(45) Date of Patent: Oct. 16, 2012

(54) METHOD FORMING CONTACT PLUG FOR SEMICONDUCTOR DEVICE USING H2 REMOTE PLASMA TREATMENT

(75) Inventors: Jin-ho Park, Gyeonggi-do (KR); Gil-heyun Choi, Seoul (KR); Sang-woo Lee, Seoul (KR); Jun-ho Park, Gyeonngi-do (KR); Ho-ki Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 495 days.

(21) Appl. No.: 12/271,220

(22) Filed: Nov. 14, 2008

(65) Prior Publication Data

US 2009/0137117 A1    May 28, 2009

(30) Foreign Application Priority Data

Nov. 15, 2007  (KR) .................... 10-2007-0116762

(51) Int. Cl.
 *H01L 21/44* (2006.01)
(52) U.S. Cl. ........ 438/653; 438/597; 438/618; 438/627; 438/643
(58) Field of Classification Search ................ 438/597, 438/618, 627, 643, 653
See application file for complete search history.

(56) References Cited

U.S. PATENT DOCUMENTS

| | | | |
|---|---|---|---|
| 2006/0089007 A1* | 4/2006 | Huang | 438/763 |
| 2006/0186452 A1* | 8/2006 | Nam et al. | 257/308 |
| 2007/0071900 A1* | 3/2007 | Soussan et al. | 427/372.2 |
| 2007/0128866 A1* | 6/2007 | Lee et al. | 438/680 |
| 2008/0045010 A1* | 2/2008 | Wongsenakhum et al. | 438/656 |
| 2009/0283499 A1* | 11/2009 | Mayer et al. | 216/90 |

FOREIGN PATENT DOCUMENTS

| | | |
|---|---|---|
| KR | 1020010045454 A | 6/2001 |
| KR | 1020010112889 A | 12/2001 |
| KR | 1020020001143 A | 1/2002 |

* cited by examiner

*Primary Examiner* — Jae Lee
(74) *Attorney, Agent, or Firm* — Myers Bigel Sibley & Sajovec

(57) ABSTRACT

Provided are methods of forming a contact plug of a semiconductor device. Methods of forming a contact plug of a semiconductor device may include forming an interlayer insulating layer on a semiconductor substrate on which a lower structure is formed, forming a contact hole in the interlayer insulating layer, the contact hole exposing the lower structure, and forming a W layer and then a WN layer to form a W/WN barrier layer in the contact hole. Methods may include $H_2$ remote plasma treating the W/WN barrier layer, forming a W-plug on the $H_2$ remote plasma treated W/WN barrier layer to fill the contact hole, and chemical mechanical polishing (CMP) the W-plug and then the W/WN barrier layer in order to expose the interlayer insulating layer.

20 Claims, 4 Drawing Sheets

METHOD FORMING CONTACT PLUG FOR SEMICONDUCTOR DEVICE USING H2 REMOTE PLASMA TREATMENT

CROSS-REFERENCE TO RELATED PATENT APPLICATION

This application claims the benefit of Korean Patent Application No. 10-2007-0116762, filed on Nov. 15, 2007, in the Korean Intellectual Property Office, the disclosure of which is incorporated herein in its entirety by reference.

BACKGROUND OF THE INVENTION

The present invention relates to semiconductor devices and, more particularly, to methods of manufacturing a semiconductor device including a contact plug.

A semiconductor device may include constituent elements such as transistors, resistors, capacitors, and metal wires. Contacts in a semiconductor device may transmit electrical signals between these constituent elements.

As the integration density of a semiconductor device increases, design rule may be reduced and high speed operation of the semiconductor device may be desirable. Accordingly, an area of a contact may also be reduced and, as a result, overall resistance of the semiconductor device may be increased.

A contact may generally be formed according to the following method. After forming a contact hole in an interlayer insulating layer to expose a lower structure thereof, a barrier layer having a predetermined thickness may be formed. A metal layer may be deposited on the barrier layer to bury the contact hole. The metal layer and the barrier layer may be etched backed or chemical mechanical polished (CMP) until the interlayer insulating layer is exposed to form a contact plug having a stack layer of the barrier layer and the metal layer barrier layer. A tungsten film may be used for the metal layer in the contact plug.

The barrier layer may be a diffusion prevention layer that may reduce contact resistance with a lower layer thereof and may prevent a reaction between the metal layer and the lower layer in the interlayer insulating layer. The barrier layer may be a Ti/TiN film that has a high step coverage characteristic and may be formed using a chemical vapor deposition (CVD) process. However, since the Ti/TiN film may have a specific resistance much higher than that of the tungsten film, resistance of a semiconductor device may be increased as the integration density of the semiconductor device increases. Also, as the Ti/TiN film formed by CVD process may be formed at a high temperature, other constituent elements may be thermally attacked. Accordingly, the characteristics of the other constituent elements may be degraded.

Recently, studies have been conducted to use a W/WN film formed using an atomic layer deposition (ALD) method as the barrier layer instead of the Ti/TiN film. In the case of the W/WN film formed using ALD, since the resistance characteristic of the contact plug may be improved and the contact plug may be formed at a relatively low temperature (approximately 300° C.), the degradation of the device characteristics of other constituent elements of the semiconductor device may be prevented.

However, in a contact plug structure of W/WN/W, the contact, in particular, may be rapidly etched away from the edge portion thereof since the W in the barrier layer may have a low etch selectivity with respect to a wet chemical material, for example, $H_2O_2$ during chemical mechanical polishing a plug having W (hereinafter, referred to as W-plug). The W in the barrier layer may have an etch selectivity of ⅙ of that of the WN in the barrier layer. In some cases, the W-plug may be pulled out from the contact, the occurrence of which is called a pull-out phenomenon. The reason for this may be that since the W-plug may have an area smaller than that of the W in the barrier layer, the W in the barrier layer may be rapidly dissolved along sidewalls of the contact.

FIG. 1 is a plan view scanning electron microscope (SEM) image showing a W-plug pulled-out from a contact. From FIG. 1, it may be observed that a cylindrical W-plug is pulled-out from a contact and contact holes are vacant.

In order to address the above problems, a method of direct-nitridating W has been attempted using plasma when W/WN barrier layer is formed. However, this may cause another problem in that the WN film may be etched due to back bias power during the nitridation plasma process.

SUMMARY OF THE INVENTION

Some embodiments of the present invention include methods of forming a contact plug of a semiconductor device. Methods may include forming an interlayer insulating layer on a semiconductor substrate on which a lower structure is formed, forming a contact hole in the interlayer insulating layer, the contact hole exposing the lower structure, and forming a W layer and then a WN layer to form a W/WN barrier layer in the contact hole. Some embodiments may include $H_2$ remote plasma treating the W/WN barrier layer, forming a W-plug on the $H_2$ remote plasma treated W/WN barrier layer to fill the contact hole, and chemical mechanical polishing (CMP) the W-plug and then the W/WN barrier layer in order to expose the interlayer insulating layer.

In some embodiments, the $H_2$ remote plasma treating includes using a $H_2$ source material. Some embodiments provide that forming W/WN barrier layer includes using an atomic layer deposition (ALD) method, a pulsed nucleation layer (PNL) method, a chemical vapor deposition (CVD) method, and/or a cyclic CVD method.

In some embodiments, forming of the W/WN barrier layer includes using $WF_6$ as the source material. Some embodiments provide that forming of the W/WN barrier layer includes using $B_2H_6$, $SiH_4$, $Si_2H_6$, and/or a combination thereof as a reaction material that reacts with the source material.

In some embodiments, the $H_2$ remote plasma treating of the W/WN barrier layer includes performing the $H_2$ remote plasma treating of the W/WN barrier layer in-situ in the same equipment in which the W/WN is deposited. In some embodiments, the in-situ $H_2$ remote plasma treating of the W/WN barrier layer includes performing the in-situ $H_2$ remote plasma treating of the W/WN barrier layer in the same chamber in which the W/WN is deposited.

In some embodiments, forming the W-plug includes using an ALD method, a PNL method, a cyclic CVD method, a CVD method, and/or a physical vapor deposition (PVD) method. Some embodiments provide that the W/WN barrier layer includes a thickness in a range from 20 to 200 Å, and wherein the WN includes a thickness in a range from 50 to 500 Å.

In some embodiments, chemical mechanical polishing includes using a wet chemical material having $H_2O_2$. Some embodiments provide that the lower structure includes an impurity region, a gate electrode, a contact pad, a bit line, and/or a metal wire formed on the semiconductor substrate. In some embodiments, the interlayer insulating layer includes a low-dielectric layer.

Some embodiments of the present invention include methods of forming a contact plug of a semiconductor device. Such methods may include treating, using $H_2$ remote plasma, a W/WN barrier layer in a contact hole that is formed in an interlayer insulating layer on a semiconductor substrate, forming a W-plug on the $H_2$ remote plasma treated W/WN barrier layer to fill the contact hole, and chemical mechanical polishing (CMP) the W-plug and then the W/WN barrier layer in order to expose the interlayer insulating layer.

In some embodiments, the semiconductor substrate includes a lower structure that is exposed by the contact hole. Some embodiments provide that the lower structure includes an impurity region, a gate electrode, a contact pad, a bit line, and/or a metal wire formed on the semiconductor substrate. In some embodiments, treating, using the $H_2$ remote plasma, includes using a $H_2$ source material. Some embodiments provide that forming the W-plug includes using an ALD method, a PNL method, a cyclic CVD method, a CVD method, and/or a physical vapor deposition (PVD) method. In some embodiments, the interlayer insulating layer includes a low-dielectric layer.

Methods of forming a contact plug of a semiconductor device according to some embodiments may include forming a low dielectric interlayer insulating layer on a semiconductor substrate on which a lower structure is formed, forming a contact hole in the low dielectric interlayer insulating layer, the contact hole exposing the lower structure, and sequentially forming a W layer and a WN layer to form a W/WN barrier layer in the contact hole using $WF_6$ as the source material. Methods may include $H_2$ remote plasma treating the W/WN barrier layer in-situ in the same equipment in which the W/WN is deposited, forming a W-plug on the $H_2$ remote plasma treated W/WN barrier layer to fill the contact hole using an ALD method, a PNL method, a cyclic CVD method, a CVD method, and/or a physical vapor deposition (PVD) method, and chemical mechanical polishing (CMP) the W-plug and then the W/WN barrier layer in order to expose the interlayer insulating layer using a wet chemical material having $H_2O_2$. In some embodiments, the lower structure includes an impurity region, a gate electrode, a contact pad, a bit line, and/or a metal wire formed on the semiconductor substrate.

DETAILED DESCRIPTION OF THE INVENTION

Figure 1A:
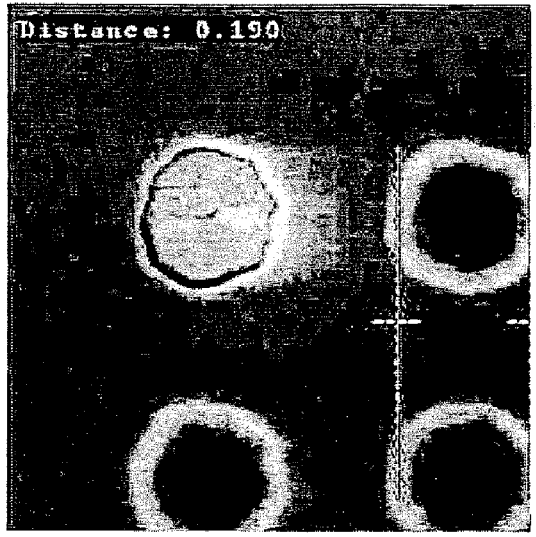
FIG. 1 is a plan view scanning electron microscope (SEM) image showing a W-plug pulled-out from a contact, according to conventional art.
Figure 1B:
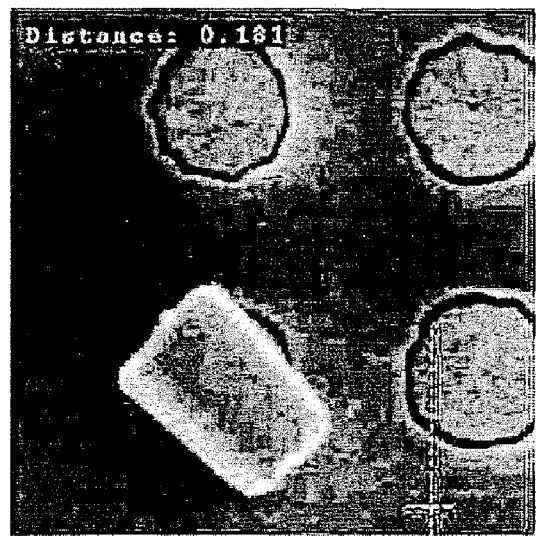
Figure 1C:
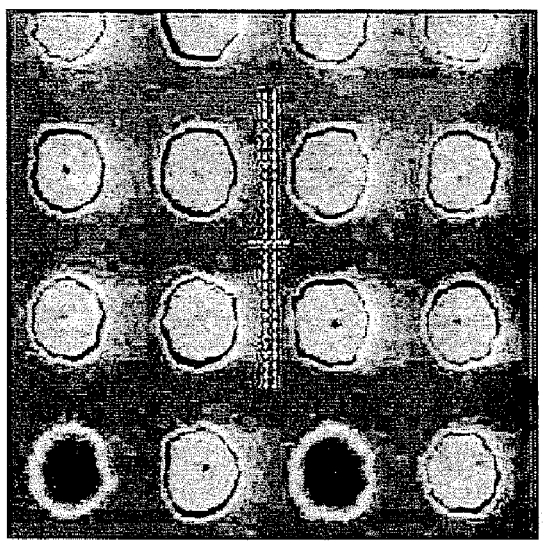
Figure 1D:
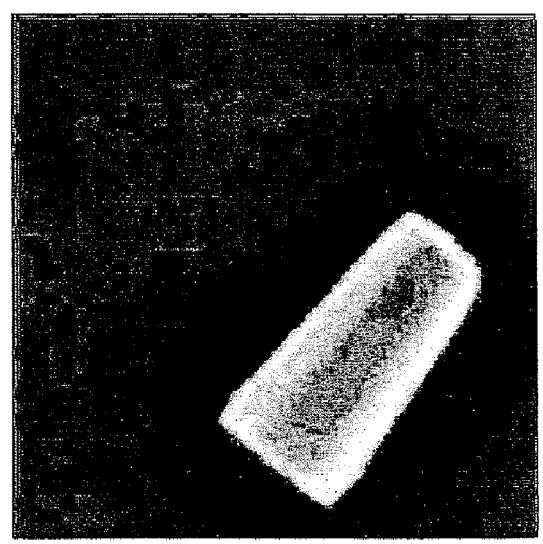

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation. Like numbers refer to like elements throughout.

In the figures, the dimensions of structural components, including layers and regions among others, are not to scale and may be exaggerated to provide clarity of the concepts herein. It will also be understood that when a layer (or layer) is referred to as being 'on' another layer or substrate, it can be directly on the other layer or substrate, or can be separated by intervening layers. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 2A through 2E are cross-sectional views for explaining methods of forming a contact plug of a semiconductor device according to some embodiments of the present invention.

Figure 2A:
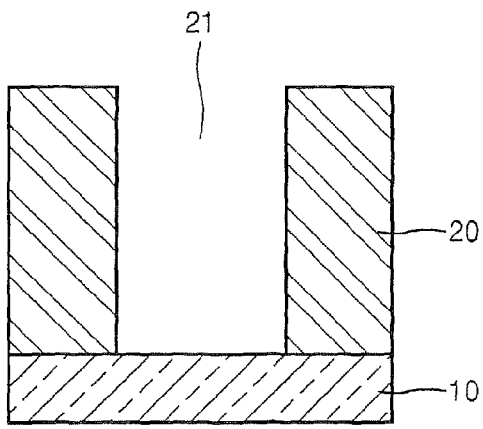
FIGS. 2A through 2E are cross-sectional views for explaining methods of forming a contact plug of a semiconductor device according to some embodiments of the present invention.

Referring to FIG. 2A, an interlayer insulating layer 20 may be formed on a semiconductor substrate 10 on which a lower structure (not shown) is formed. A contact hole 21 that is connected to the lower structure may be formed in the interlayer insulating layer 20. In some embodiments, the lower structure may include elements such as an impurity region, a gate electrode, a contact pad, a bit line, and/or a metal wire, among others. The interlayer insulating layer 20 may be a conventional silicon oxide film and/or a low dielectric film, among others.

Figure 2B:
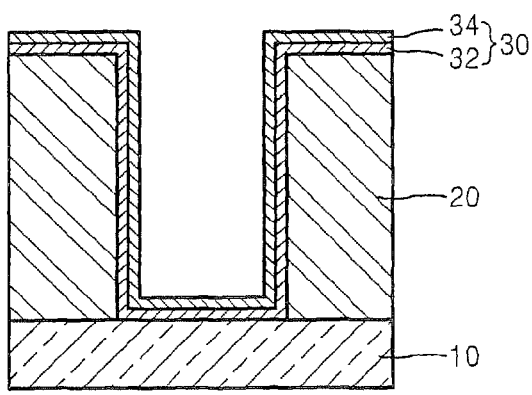

Referring to FIG. 2B, a barrier layer 30 having a W layer 32 and a WN layer 34 may be formed in the contact hole 21 that is formed in the interlayer insulating layer 20. The barrier layer 30 may be formed using an atomic layer deposition (ALD) method, chemical vapor deposition (CVD), and/or a pseudo ALD method such as a pulsed nucleation layer (PNL) method, a cyclic CVD method, and/or a CVD method, among others. As the size of the semiconductor device is reduced, the size of the contact may also decrease, and thus, the thickness of the contact barrier layer may be thin. In some embodiments, the W layer 32 in the barrier layer 30 may be deposited to a thickness in a range from 20 to 200 Å, and the WN layer 34 in the barrier layer 30 may be deposited to a thickness in a range from 50 to 500 Å. Some embodiments provide that the barrier layer 30 having W/WN using the ALD method, the PNL method, and/or the CVD method may have a high step difference coverage characteristic, and thus, may be formed to be thin. Some embodiments may use $WF_6$ as a source gas and $B_2H_6$, $SiH_4$, and/or $Si_2H_6$ as a reaction gas that reacts with the source gas. In some embodiments, pure W may not be used. For example, some embodiments provide that $WF_6$ may be used for a tungsten source. In this regard, impurities that may include fluorine (F) may remain after forming W/WN layers. In some embodiments, the tungsten having the fluorine impurities may be weaker than pure tungsten with respect to a wet chemical material used in the chemical mechanical polishing (CMP) process for polishing the W-plug in one or more subsequent processes. Thus, it may be necessary to reduce the amount of the fluorine impurities when the barrier layer 30 having W/WN layers (hereinafter, referred to W/WN barrier layer 30) is formed.

Figure 2C:
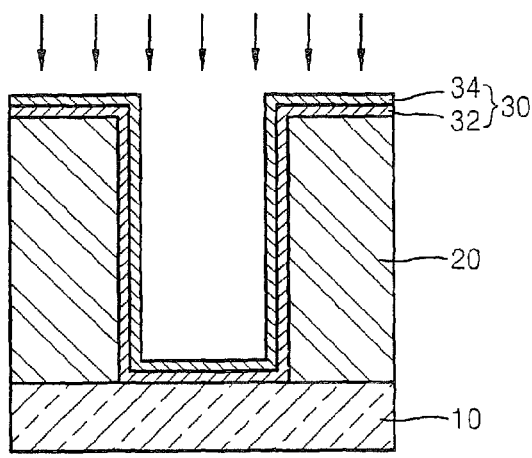

Referring to FIG. 2C, the impurities such as, for example, fluorine impurities, may be removed by treating a surface of the barrier layer 30 having W/WN layers with $H_2$ remote plasma as indicated by the arrows. In some embodiments, the $H_2$ remote plasma may include radicals having hydrogen (hereinafter, referred to H radicals) and may be generated from a plasma generator installed outside of the chamber. The $H_2$ remote plasma may then be introduced into the chamber. The H radicals may remove the fluorine impurities by reacting with the fluorine impurities that remain in the barrier layer 30 after the barrier layer 30 is formed.

In some embodiments, the $H_2$ remote plasma treatment may be performed in-situ in the same equipment in which the W/WN barrier layer 30 is deposited. Some embodiments provide that the $H_2$ remote plasma treatment may be performed in a $H_2$ remote plasma treatment chamber that is separated from the W/WN deposition chamber or may be performed in the same chamber where the W/WN deposition is performed.

Figure 2D:
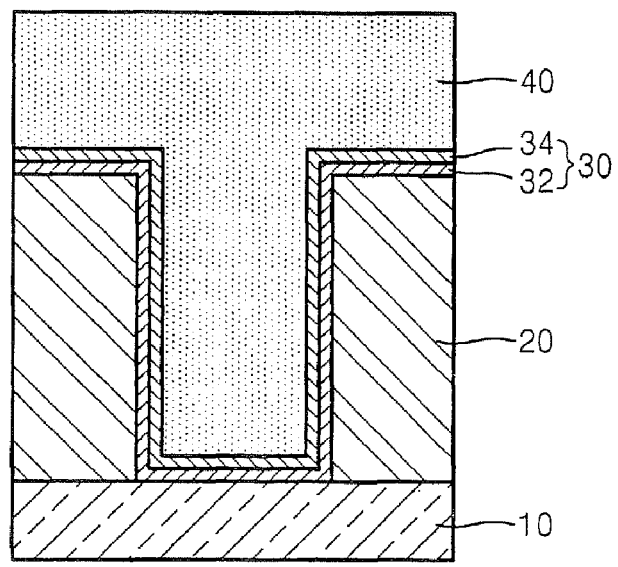

Referring to FIG. 2D, a W-plug 40 may be deposited on the W/WN barrier layer 30 that is $H_2$ remote plasma treated to fill the contact hole 21. In some embodiments, the W-plug 40 may be deposited using a physical vapor deposition (PVD) method, an ALD method, a PNL method, a cyclic CVD method, and/or a CVD method as used in depositing the W/WD barrier layer 30.

Figure 2E:
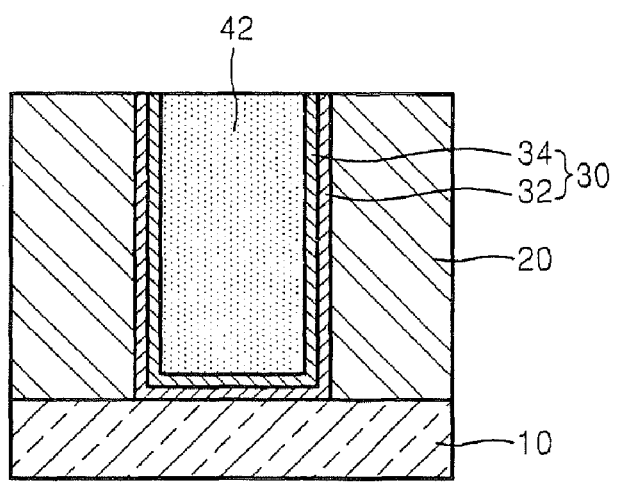

Referring to FIG. 2E, the W-plug 40 and the W/WN barrier layer 30 may be sequentially chemically and mechanically polished until the interlayer insulating layer 20 is exposed, thereby forming a contact plug 42. Some embodiments provide that the contact plug 42 electrically connects the lower structure and an upper structure to be formed in one or more subsequent processes. Accordingly, it may be important to form the contact plug 42 such that it will not be pulled out of the contact hole.

The wet chemical material having $H_2O_2$ and used for the chemical mechanical polishing (CMP) process in which the W-plug 40 is a main target may have a low etch selectivity with respect to the W layer 32 in the W/WN barrier layer 30. The etch selectivity of the wet chemical material with respect to the W layer 32 in the W/WN barrier layer 30 may be measured as approximately ⅙ of that of the WN 34 layer in the W/WN barrier layer 30. In particular, when tungsten includes fluorine impurities, it may be seen that the etch selectivity may be further reduced. In some embodiments, an upper portion of the W-plug 40 may be removed and/or dissolved during the CMP of the W-plug 40, and the wet chemical material (slurry) used in the CMP process may contact the W/WN barrier layer 30. However, after the W/WN barrier layer 30 is $H_2$ remote plasma treated, the W layer 32 in the W/WN barrier layer 30 may not be dissolved.

According to some embodiments of the present invention, after the W/WN barrier layer 30 is $H_2$ remote plasma treated, the W layer 32 and the WN layer 34 in the W/WN barrier layer 30 may not be dissolved by the slurry used for the CMP process during a tungsten CMP used for forming the contact plug 42. In this regard, the phenomenon of the contact plug 42 pulling out of from the contact hole 21 may not occur. This may be because the etch selectivity of the W layer 32 in the W/WN barrier layer 30 with respect to the CMP slurry is increased since the fluorine impurities remaining on the W/WN barrier layer 30 are effectively removed by the $H_2$ remote plasma.

Figure 3:
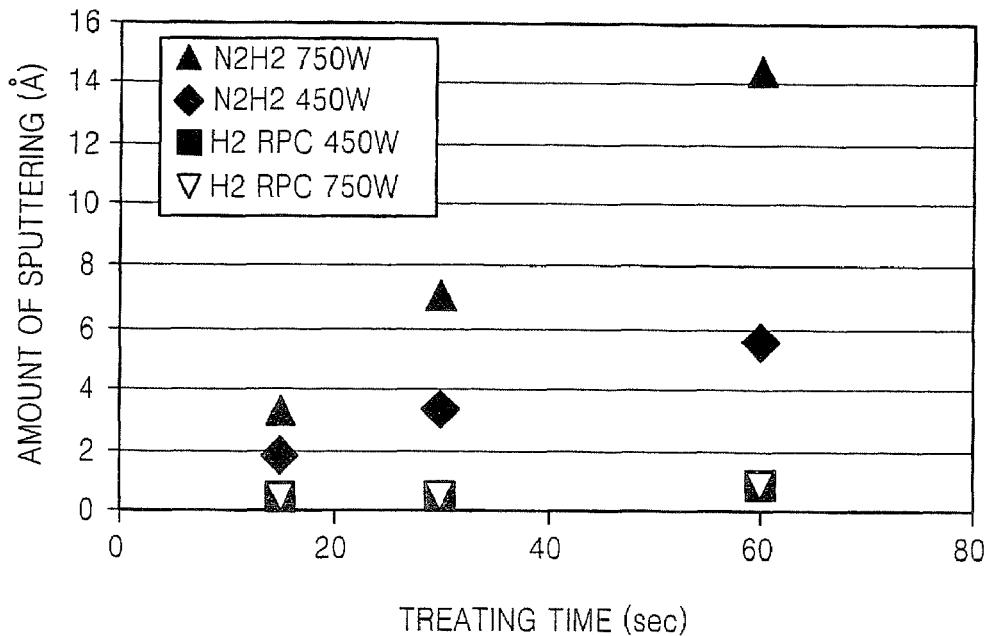
FIG. 3 is a graph illustrating the amount of sputtering of W/WN in a comparison of a direct plasma treatment and a remote plasma treatment.

Reference is now made to FIG. 3, which is a graph illustrating the amount of sputter etching of W/WN in a comparison of a direct plasma treatment and a remote plasma treatment according to some embodiments of the present invention. A symbol ▲ indicates a sputtering amount of W/WN layers with respect to treating time when the W/WN layer is direct plasma treated with $N_2$ and $H_2$ gases at a power of 750 W. A symbol ♦ indicates a sputtering amount of W/WN with respect to treating time when the W/WN layer is direct plasma treated with $N_2$ and $H_2$ gases at a power of 450 W. A symbol ∇ indicates a sputtering amount of W/WN with respect to treating time when the W/WN layer is remote plasma treated with $H_2$ gas at a power of 750 W. A symbol ■ indicates a sputtering amount of W/WN with respect to treating time when the W/WN layer is remote plasma treated with $H_2$ gas at a power of 450 W.

As illustrated in FIG. 3, in the remote plasma treatment indicated by the symbols ∇ and ■, an insignificant amount of the W/WN is not sputter etched over time regardless of the plasma power. In contrast, in the direct plasma treatment indicated by the symbols ▲ and ♦, the amount of sputter etching of the W/WN is gradually increased as time passes. Further, the amount of the sputter etching of the W/WN is increased as the plasma power is increased. In this regard, it may be concluded that the loss of the W/WN barrier layer 30 due to the sputter etch may not substantially occur when a surface of the W/WN barrier layer 30 is remote plasma treated.

Figure 4:
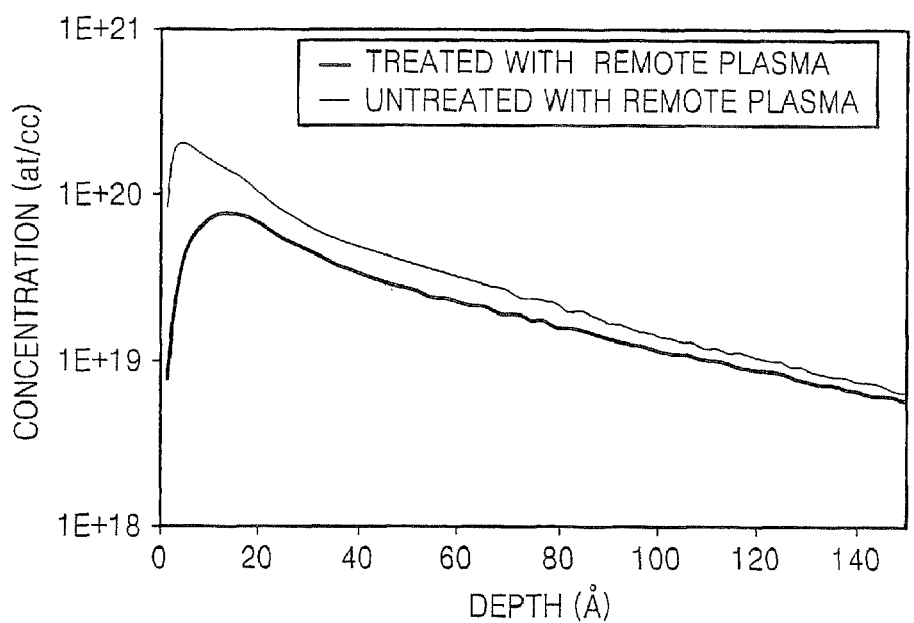
FIG. 4 is a graph illustrating the concentration reduction of fluorine (F) impurities in a W film for a barrier layer when the W film is $H_2$ remote plasma treated.

Reference is now made to FIG. 4, which is a graph illustrating the concentration reduction of fluorine (F) impurities in a W film for a barrier layer when the W film is $H_2$ remote plasma treated. As illustrated, the thin line represents the concentration of fluorine with respect to the depth of the W layer used for a barrier layer from a surface of the W layer when the W is not $H_2$ remote plasma treated. The thick line represents the concentration of fluorine with respect to the depth of the W layer used for a barrier layer from the surface of the W layer after the W layer is $H_2$ remote plasma treated. In the experiment described herein, the concentration of fluorine according to depth was measured using a secondary ion mass spectrometry (SIMS) method. As illustrated in FIG. 4, it may be seen that the concentration of fluorine in the W layer when $H_2$ remote plasma treated is lower in the entire depth range than in the W layer which is not $H_2$ remote plasma treated.

According to some embodiments of the present invention, after forming a W/WN barrier layer, impurities on a surface of the barrier layer may be removed by treating with $H_2$ remote plasma. In this regard, an etch selectivity of the W layer in the barrier layer with respect to a wet chemical material used for a CMP process for polishing W may be increased. Accordingly, a phenomenon of pulling out a W-plug from a contact due to dissolving of the W of the barrier layer may be prevented.

Although the present invention has been described in terms of specific embodiments, the present invention is not intended to be limited by the embodiments described herein. Thus, the scope may be determined by the following claims.

What is claimed is:

1. A method of forming a contact plug of a semiconductor device, comprising:
   forming an interlayer insulating layer on a semiconductor substrate on which a lower structure is formed;
   forming a contact hole in the interlayer insulating layer, the contact hole exposing the lower structure;
   forming a W layer and then a WN layer to form a W/WN barrier layer that includes fluorine in the contact hole using a pulsed nucleation layer (PNL) method, a chemical vapor deposition (CVD) method, and/or a cyclic CVD method;
   reducing a fluorine concentration within the W/WN barrier layer using a $H_2$ remote plasma treatment;
   forming a W-plug on the $H_2$ remote plasma treated W/WN barrier layer to fill the contact hole; and
   chemical mechanical polishing (CMP) the W-plug and then the W/WN barrier layer in order to expose the interlayer insulating layer.

2. The method of claim 1, wherein the $H_2$ remote plasma treating comprises using a $H_2$ source material.

3. The method of claim 1, wherein forming W/WN barrier layer comprises using an atomic layer deposition (ALD) method.

4. The method of claim 3, wherein forming of the W/WN barrier layer comprises using $WF_6$ as the source material.

5. The method of claim 4, wherein forming of the W/WN barrier layer comprises using $B_2H_6$, $SiH_4$, $Si_2H_6$, and/or a combination thereof as a reaction material that reacts with the source material.

6. The method of claim 1, wherein the $H_2$ remote plasma treating of the W/WN barrier layer comprises performing the $H_2$ remote plasma treating of the W/WN barrier layer in-situ in the same equipment in which the W/WN is deposited.

7. The method of claim 6, wherein the in-situ $H_2$ remote plasma treating of the W/WN barrier layer comprises performing the in-situ $H_2$ remote plasma treating of the W/WN barrier layer in the same chamber in which the W/WN is deposited.

8. The method of claim 1, wherein forming the W-plug comprises using an ALD method, a PNL method, a cyclic CVD method, a CVD method, and/or a physical vapor deposition (PVD) method.

9. The method of claim 1, wherein the W/WN barrier layer comprises a thickness in a range from 20 to 200 Å, and wherein the WN comprises a thickness in a range from 50 to 500 Å.

10. The method of claim 1, wherein chemical mechanical polishing comprises using a wet chemical material having $H_2O_2$.

11. The method of claim 1, wherein the lower structure comprises an impurity region, a gate electrode, a contact pad, a bit line, and/or a metal wire formed on the semiconductor substrate.

12. The method of claim 1, wherein the interlayer insulating layer comprises a low-dielectric layer.

13. A method of forming a contact plug of a semiconductor device, comprising:
    reducing, using $H_2$ remote plasma, a fluorine concentration within a W/WN barrier layer that includes fluorine and that is in a contact hole that is formed in an interlayer insulating layer on a semiconductor substrate;
    forming a W-plug on the reduced fluorine concentration W/WN barrier layer to fill the contact hole; and
    chemical mechanical polishing (CMP) the W-plug and then the W/WN barrier layer in order to expose the interlayer insulating layer,
    wherein forming the W-plug comprises using an ALD method, a PNL method, a cyclic CVD method, and/or a physical vapor deposition (PVD) method.

14. The method of claim 13, wherein the semiconductor substrate comprises a lower structure that is exposed by the contact hole.

15. The method of claim 14, wherein the lower structure comprises an impurity region, a gate electrode, a contact pad, a bit line, and/or a metal wire formed on the semiconductor substrate.

16. The method of claim 13, wherein treating, using the $H_2$ remote plasma, comprises using a $H_2$ source material.

17. The method of claim 13, wherein forming the W-plug comprises using a CVD method.

18. The method of claim 13, wherein the interlayer insulating layer comprises a low-dielectric layer.

19. A method of forming a contact plug of a semiconductor device, comprising:
    forming a low dielectric interlayer insulating layer on a semiconductor substrate on which a lower structure is formed;
    forming a contact hole in the low dielectric interlayer insulating layer, the contact hole exposing the lower structure;
    forming a W layer and then a WN layer to form a W/WN barrier layer that includes fluorine in the contact hole using a pulsed nucleation layer (PNL) method, a chemical vapor deposition (CVD) method, and/or a cyclic CVD method;
    reducing a fluorine concentration within the W/WN barrier layer using $H_2$ remote plasma treatment on the W/WN barrier layer in-situ in the same equipment in which the W/WN is deposited;
    forming a W-plug on the reduced fluorine concentration W/WN barrier layer to fill the contact hole using an ALD method, a PNL method, a cyclic CVD method, and/or a physical vapor deposition (PVD) method; and
    chemical mechanical polishing (CMP) the W-plug and then the W/WN barrier layer in order to expose the interlayer insulating layer using a wet chemical material having $H_2O_2$.

20. The method of claim 19, wherein the lower structure comprises an impurity region, a gate electrode, a contact pad, a bit line, and/or a metal wire formed on the semiconductor substrate.

* * * * *